United States Patent
Wu

(10) Patent No.: US 9,066,590 B2
(45) Date of Patent: Jun. 30, 2015

(54) INDUSTRIAL COMPUTER CABINET AND TWO-WAY SLIDE RAIL STRUCTURE THEREOF

(71) Applicant: AIC INC., Taoyuan Hsien (TW)

(72) Inventor: Wei-Shih Wu, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 0 days.

(21) Appl. No.: 14/167,395

(22) Filed: Jan. 29, 2014

(65) Prior Publication Data

US 2015/0123528 A1 May 7, 2015

(30) Foreign Application Priority Data

Nov. 6, 2013 (TW) .............................. 102140381 A

(51) Int. Cl.
*A47B 88/00* (2006.01)
*A47B 88/04* (2006.01)
*A47B 88/16* (2006.01)
*H05K 5/02* (2006.01)

(52) U.S. Cl.
CPC ............. *A47B 88/04* (2013.01); *A47B 88/0085* (2013.01); *A47B 88/0466* (2013.01); *A47B 88/16* (2013.01); *H05K 5/0217* (2013.01)

(58) Field of Classification Search
CPC ............... A47B 88/0085; A47B 88/04; A47B 2088/0403; A47B 88/0407; A47B 2210/0059; A47B 88/0466; A47B 2210/0008; A47B 2210/001; A47B 2210/0037; A47B 2210/0043; A47B 88/08; A47B 88/10; A47B 88/12; A47B 88/14; A47B 88/16; A47B 2210/0016; A47B 2210/0018; A47B 2210/0064; A47B 2210/0067; A47B 2210/0072; A47B 2210/0081; H05K 5/0217
See application file for complete search history.

(56) References Cited

U.S. PATENT DOCUMENTS

| | | | | | |
|---|---|---|---|---|---|
| 1,343,513 | A | * | 6/1920 | Lenhart | 312/334.12 |
| 2,565,784 | A | * | 8/1951 | Sheean | 312/286 |
| 2,914,370 | A | * | 11/1959 | Hensch et al. | 312/286 |
| 3,485,539 | A | * | 12/1969 | Vaughn et al. | 384/19 |
| 4,183,596 | A | * | 1/1980 | Greene et al. | 312/333 |
| 4,872,734 | A | * | 10/1989 | Rechberg | 312/333 |
| 5,085,523 | A | * | 2/1992 | Hobbs | 384/21 |
| 5,624,171 | A | * | 4/1997 | Soja et al. | 312/334.8 |
| 5,851,059 | A | * | 12/1998 | Cirocco | 312/334.11 |
| 5,871,265 | A | * | 2/1999 | Stewart et al. | 312/334.8 |
| 8,147,011 | B2 | * | 4/2012 | Chen et al. | 312/333 |

(Continued)

FOREIGN PATENT DOCUMENTS

EP 2428136 A1 * 8/2011 ............. A47B 88/10

*Primary Examiner* — Daniel J Troy
*Assistant Examiner* — Andrew Roersma
(74) *Attorney, Agent, or Firm* — Chun-Ming Shih; HDLS IPR Services

(57) ABSTRACT

In an industrial computer cabinet and a two-way slide rail structure, the industrial computer cabinet includes a cabinet having a receiving space, a first opening, and a second opening; a drawer in the receiving space; and a two-way slide rail assembly including a first slide rail assembly having at least one slide rail, a second slide rail assembly, and at least one roller installed on the second slide rail assembly and rolling along the slide rail. The two openings communicate with the receiving space, at opposite sides thereof. The first slide rail assembly is fixed to one of the cabinet and the drawer; the second slide rail assembly is fixed to the other such that the drawer can be pulled out, sliding relatively to the cabinet through the first or the second opening, enhancing the use convenience of the industrial computer cabinet.

6 Claims, 11 Drawing Sheets

(56) References Cited

U.S. PATENT DOCUMENTS

| | | | |
|---|---|---|---|
| 8,511,765 B1 * | 8/2013 | Chen et al. | 312/333 |
| 2005/0017614 A1 * | 1/2005 | Cirocco et al. | 312/333 |
| 2005/0274680 A1 * | 12/2005 | Allen et al. | 211/26 |

* cited by examiner

INDUSTRIAL COMPUTER CABINET AND TWO-WAY SLIDE RAIL STRUCTURE THEREOF

BACKGROUND OF THE INVENTION

1. Field of the Invention

The present invention relates to a computer cabinet, and in particular, to an industrial computer cabinet and a two-way slide rail structure thereof.

2. Description of Related Art

The traditional industrial computer cabinet has a cabinet and several drawers installed in the cabinet such that the industrial computer apparatuses, such as servers and operation units, can be grouped together and received by classification in the respective drawers, which helps the administrators to facilitate the management.

Between the above-mentioned cabinet and each respective drawer, a slide rail structure is formed. The slide rail structure comprises a first slide rail assembly and a second slide rail assembly. One of the first slide rail assembly and the second slide rail assembly is fixed to the cabinet; the other one of the first slide rail and the second slide rail is fixed to the respective drawer. The first slide rail assembly is provided with a slide rail; the second slide rail assembly is provided with a ball bearing. The ball bearing rolls along the slide rail such that the respective drawer, sliding with respect to the cabinet, can be pulled out in the same direction, which facilitates maintenance or arrangement of the industrial computers.

However, because the ball bearing includes a fixed seat and a ball, the fixed seat provided with a groove for receiving the ball which contacts and rolls along the groove, the heavy weight of industrial computer apparatuses usually causes excessive force exerted on the ball, thus resulting in an increase of the friction between the ball and the groove. As a result, the ball cannot roll and the ball bearing malfunctions. Also, all of the drawers can be pulled out only in one direction, which is inconvenient.

In view of foregoing, the inventor pays special attention regarding the above existing technology to research with the application of related theory and tries to overcome the above disadvantages, which becomes the goal of the inventor's improvement.

SUMMARY OF THE INVENTION

The present invention is to provide an industrial computer cabinet and a two-way slide rail structure thereof, which use the rollers installed on a second slide rail assembly and rolling along a slide rail such that a drawer can be pulled out by sliding with respect to the cabinet through either a first opening or a second opening of a cabinet in two different directions. Further, the drawer can be moved smoothly even when excessive force is exerted to the rollers, enhancing the convenience of using the industrial computer cabinet.

The present invention provides a two-way slide rail structure comprising:

a two-way slide rail assembly comprising:
   a first slide rail assembly provided with at least one slide rail;
   a second slide rail assembly disposed corresponding to the first slide rail assembly; and
   at least one roller installed on the second slide rail assembly and rolling along the at least one slide rail such that the first slide rail assembly slides with respect to the second slide rail assembly; and
   at least one stop assembly attached between the first slide rail assembly and the second slide rail assembly, and correspondingly stopping and positioning the first slide rail assembly and the second slide rail assembly.

The present invention provides an industrial computer cabinet comprising:
   a cabinet having a receiving space, a first opening, and a second openings, in which the first opening and the second opening communicate with the receiving space and are disposed at opposite sides thereof;
   a drawer disposed in the receiving space; and
   a pair of the two-way slide rail structures described above, each connected between sides of the cabinet and the drawer, the respective first slide rail assembly fixed to one of the cabinet and the drawer, the respective second slide rail assembly fixed to the other of the cabinet and the drawer such that the drawer can be pulled out, sliding with respect to the cabinet through either the first opening or the second opening.

The present invention also has the following effects:

1). The rollers are installed on the second slide rail assembly and roll along the slide rail such that the drawer can be pulled out, sliding with respect to the cabinet through either the first opening or the second opening. In this way, the user can firstly take out the industrial computer apparatuses in the drawer adjacent to the first opening and the second opening to reduce the loading of maintenance or management, further enhancing the use convenience of the industrial computer cabinet.

2). The roller comprises a bolt and a wheel sleeved around the bolt. When the overloaded drawer exerts excessive force on the wheel, the wheel still rolls relatively to the bolt and maintains the rolling function, further enhancing the reliability of operation of the industrial computer cabinet.

3). Each stop assembly comprises a first stop member and a second stop member. The first stop member has a first engaging member and a first connecting member. The second stop member has a second engaging member and a second connecting member. The first engaging member and the second engaging member are both connected to one of the first slide rail assembly and the second slide rail assembly. The first connecting member and the second connecting member are both connected to the other of the first slide rail assembly and the second slide rail assembly. The first engaging member and the first connecting member can stop and position each other. The second engaging member and the second connecting member can stop and position each other. In this way, when the drawer is pulled out through either the first opening or the second opening, the drawer can be prevented from being pulled excessively or dragged by its weight to fall away from the cabinet. This can improve the structure stability of the industrial computer cabinet.

4). The number of the slide rails is two. Each first slide rail assembly extends toward the second slide rail assembly to form two U-shaped extending portions arranged in upper and lower rows. A side of the respective U-shaped extending portions forms a corresponding side wall on which the respective slide rails are formed. Also, the number of the at least one roller is above one. The rollers are spaced in parallel upper and lower rows and installed on the second slide rail assembly corresponding to the respective side walls. In this way, the forces exerted on the respective rollers are even, enhancing the sliding effect between the rollers and the slide rails.

5). Each two-way slide rail assembly further comprises an auxiliary slide rail assembly such that the two-way slide rail assembly can be fit for the cabinets of different sizes. Also, the secure locking and force exerted evenly between the two-way slide rail assemblies and the cabinet can be insured, which enables the two-way slide rail assembly to have a wide application range and great structure strength.

DETAILED DESCRIPTION OF THE INVENTION

Figure 1:
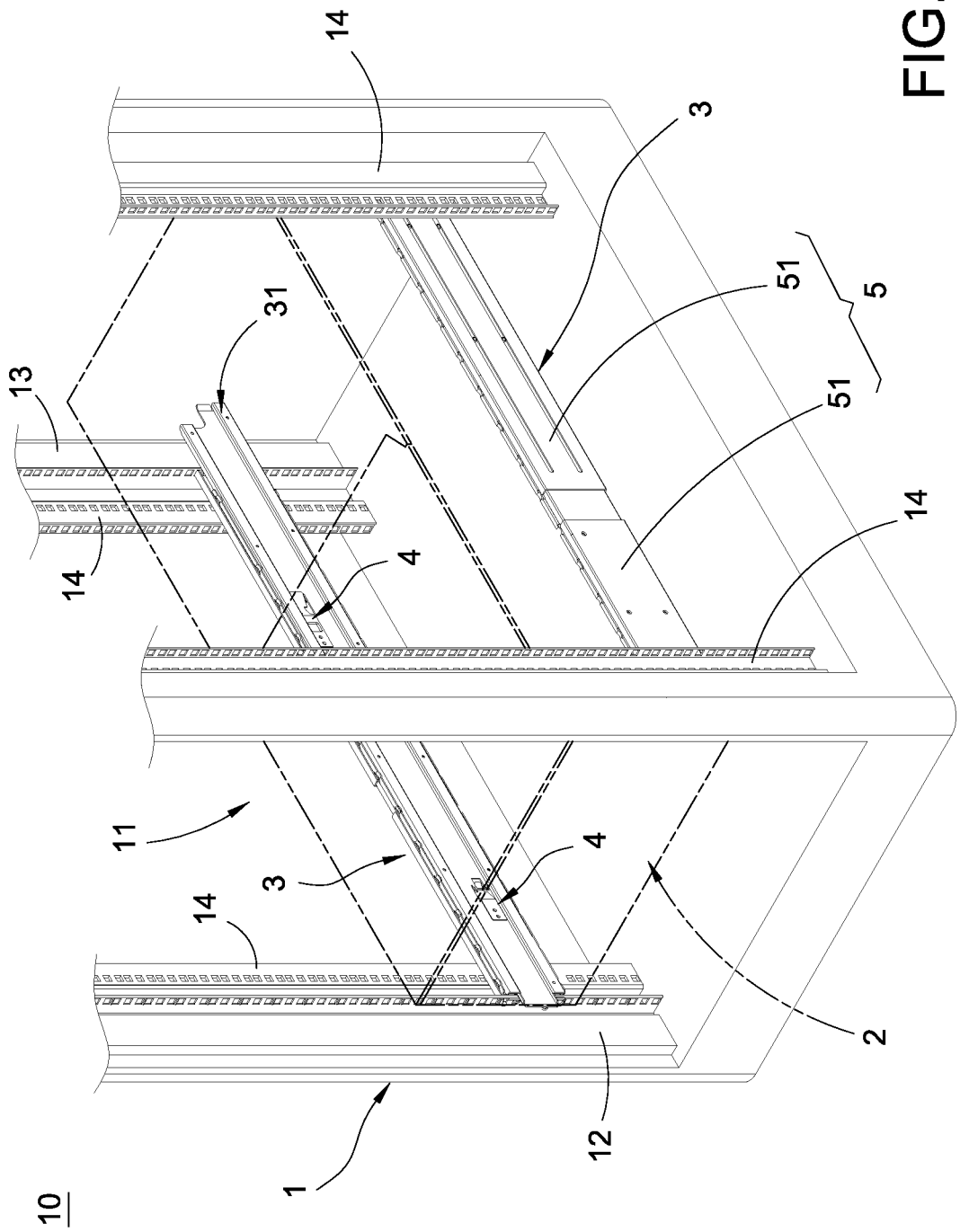
FIG. 1 is a perspective assembled view of an industrial computer cabinet according to the present invention.

The detailed description and technical contents regarding the present invention are explained as follows, accompanied with the attached figures. However, the attached figures are only used for reference and explanation, not to limit the present invention.

Please refer to FIGS. 1-8. The present invention provides an industrial computer cabinet and a two-way slide rail structure thereof. The industrial computer cabinet 10 comprises a cabinet 1, a drawer 2, and a pair of two-way slide rail structures. Each of the two-way slide rail structures comprises a two-way slide rail assembly 3 and at least one stop assembly 4.

As shown in FIG. 1, the cabinet 1 has a receiving space 11 therein, a first opening 12, and a second opening 13. The first opening 12 and the second opening 13 communicate with the receiving space 11 and are disposed at opposite sides thereof. The cabinet 1 has two frames 14 disposed at each of both sides of the receiving space 11. Also, the drawer 2 is disposed in the receiving space 11. The number of the drawers 2 can be equal to or more than one; the number of the corresponding pairs of the two-way slide rail assemblies 3 can also be equal to or more than one.

As shown in FIGS. 2-5, each of the two-way slide rail assemblies 3 is connected between the cabinet 1 and the drawer 2. The two-way slide rail assembly 3 comprises a first slide rail assembly 31, a second slide rail assembly 32, and at least one roller 33. The first slide rail assembly 31 is fixed to one of the cabinet 1 and the drawer 2; the second slide rail assembly 32 is fixed to the other one of the cabinet 1 and the drawer 2. The first slide rail assembly 31 is provided with at least one slide rail 311. The roller 33 is installed on the second slide rail assembly 32 and rolls along the slide rail 311 such that the first slide rail assembly 31 slides with respect to the second slide rail assembly 32 and further the drawer 2 can be pulled out by sliding with respect to the cabinet 1 through either the first opening 12 or the second opening 13.

Moreover, the first slide rail assembly 31 extends at one lateral side thereof to form a U-shaped extending portion 312; at least one side wall 313 is formed on a side of the U-shaped extending portion 312 to be the slide rail 311. The detailed description is given below. In the current embodiment, there are two slide rails 311 and two U-shaped extending portions 312 arranged at opposite lateral sides of the first slide rail assembly 31. Each side of one U-shaped extending portion 312 forms a corresponding side wall 313. There are plural rollers, and the rollers 33 are spaced in parallel upper and lower rows and installed on the second slide rail assembly 32, and each row of the rollers 33 is corresponding to two corresponding side walls 313 of the U-shaped extending portion 312.

In the current embodiment, two first slide rail assemblies 31 are fixed to two sides of the drawer 2, respectively, and two second slide rail assemblies 32 are fixed to frames 14, respectively. Each first slide rail assembly 31 has a first end 34 and a second end 35, and each second slide rail assembly 32 has a third end 36 and a fourth end 37.

Each second slide rail assembly 32 is provided with at least one through-hole 321. The roller 33 comprises a bolt 331, a wheel 332, and a nut 333. The wheel 332 is sleeved around the bolt 331; the nut 333 is configured corresponding to the through-hole 321; the end of the bolt 331 passes through the through-hole 321 to be fastened by the nut 333. Thus, the roller 33 is secured to the second slide rail assembly 32, and the wheel 332 is engaged with the slide rail 311 to roll in the slide rail 311.

Each of the two-way slide rail assemblies 3 further comprises an auxiliary slide rail assembly 5 having two separate extended frames 51. One of the two separate extended frames 51 is fixed to one of two frames 14; the other one of the two separate extended frames 51 is fixed to the other one of the two frames 14. Two ends of the second slide rail assembly 32 are disposed between and respectively fixed to the two separate extended frames 51.

Figure 2:
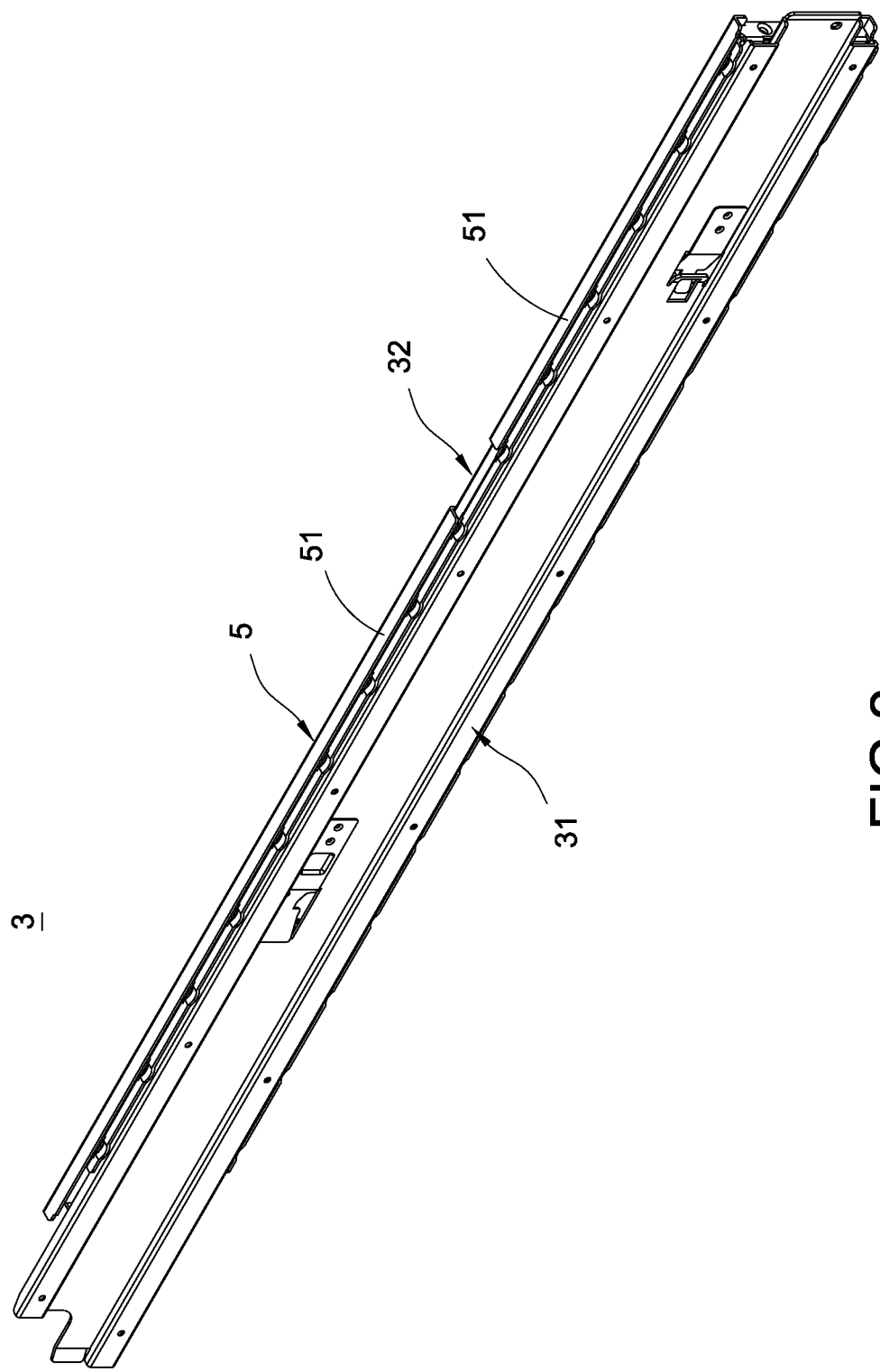
FIG. 2 is a perspective assembled view of a two-way slide rail assembly according to the present invention.
Figure 3:
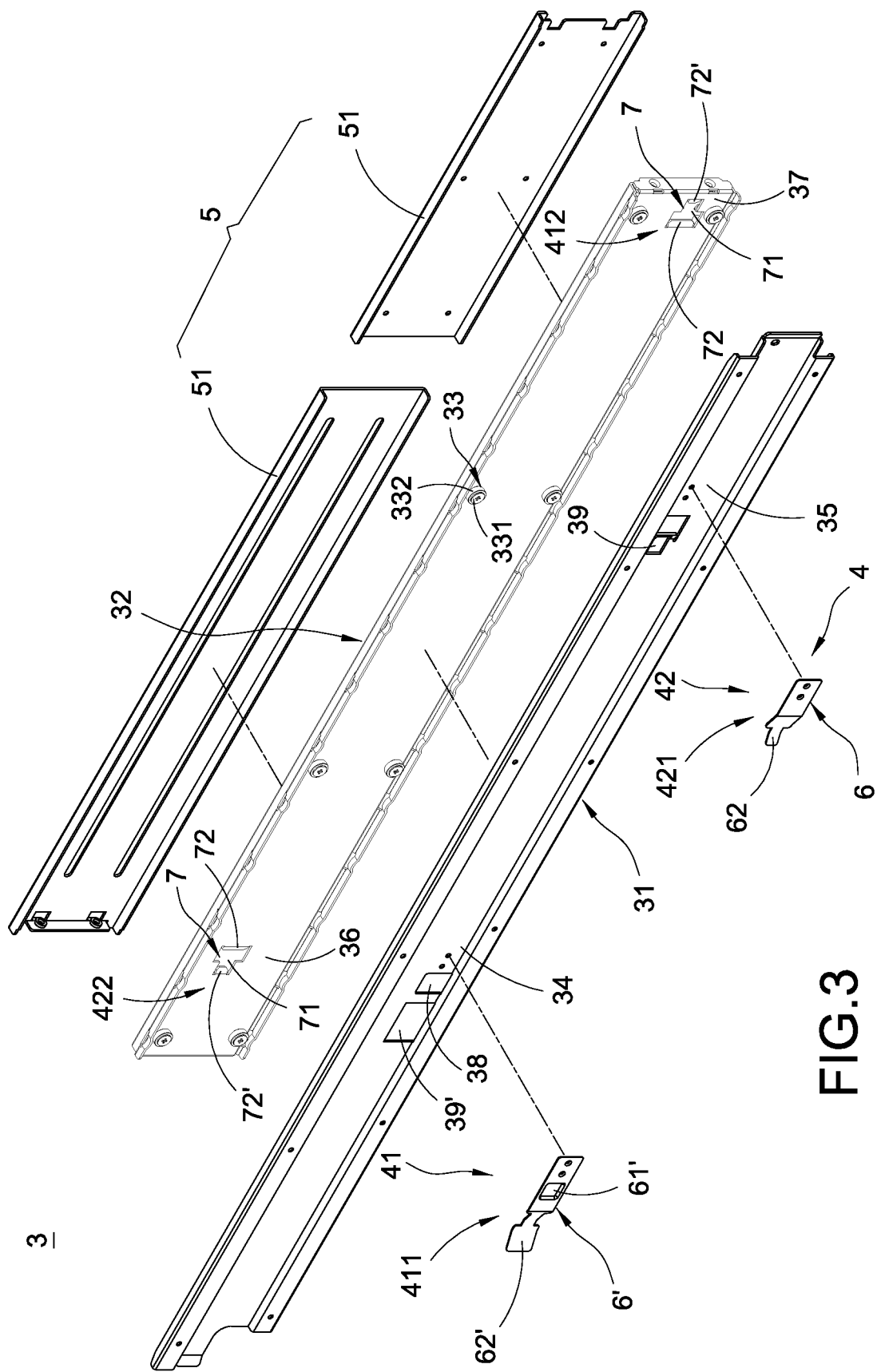
FIG. 3 is a perspective exploded view of a two-way slide rail assembly according to the present invention.
Figure 4:
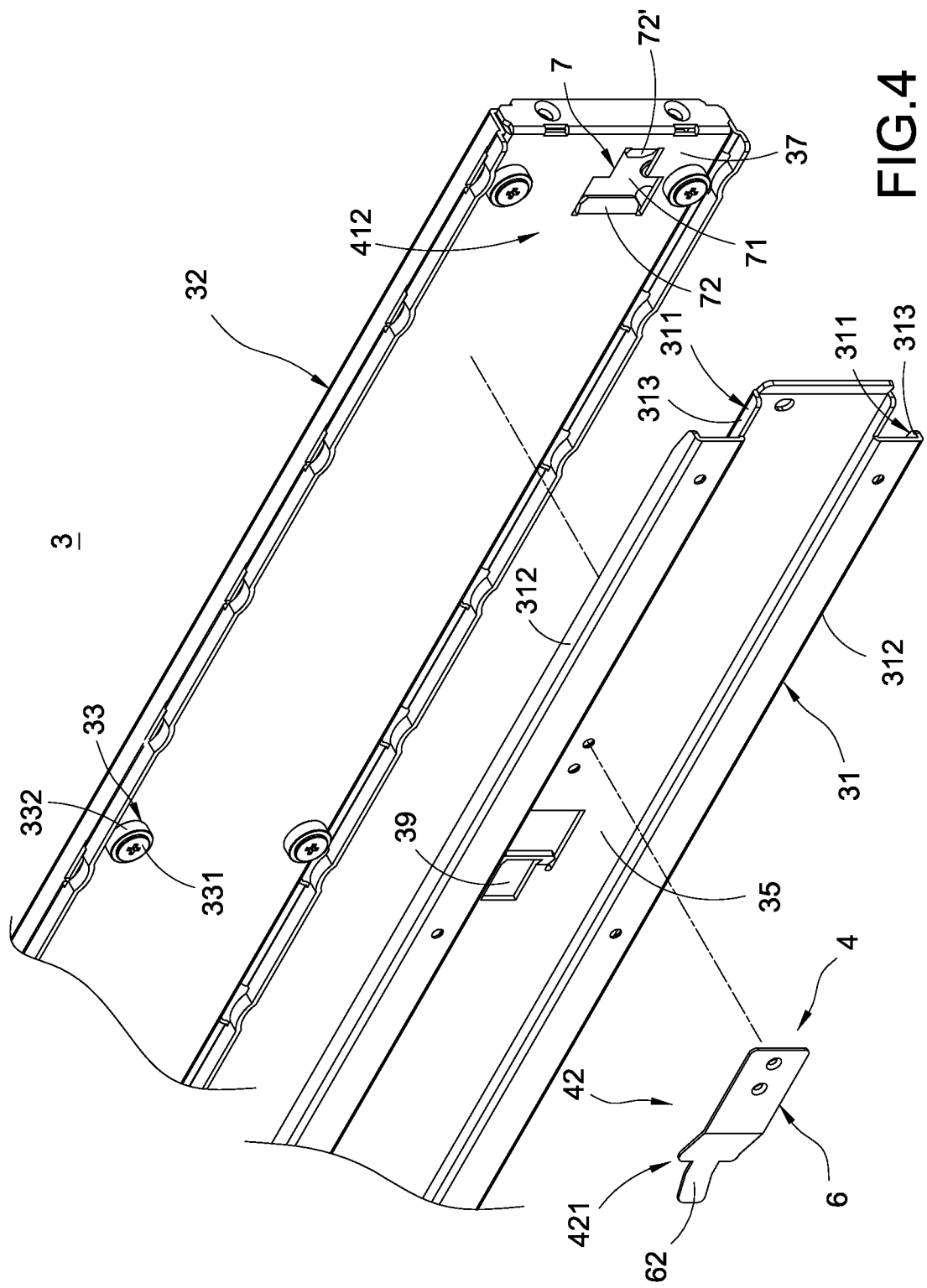
FIG. 4 is a local perspective view of a two-way slide rail assembly according to the present invention.
Figure 5:
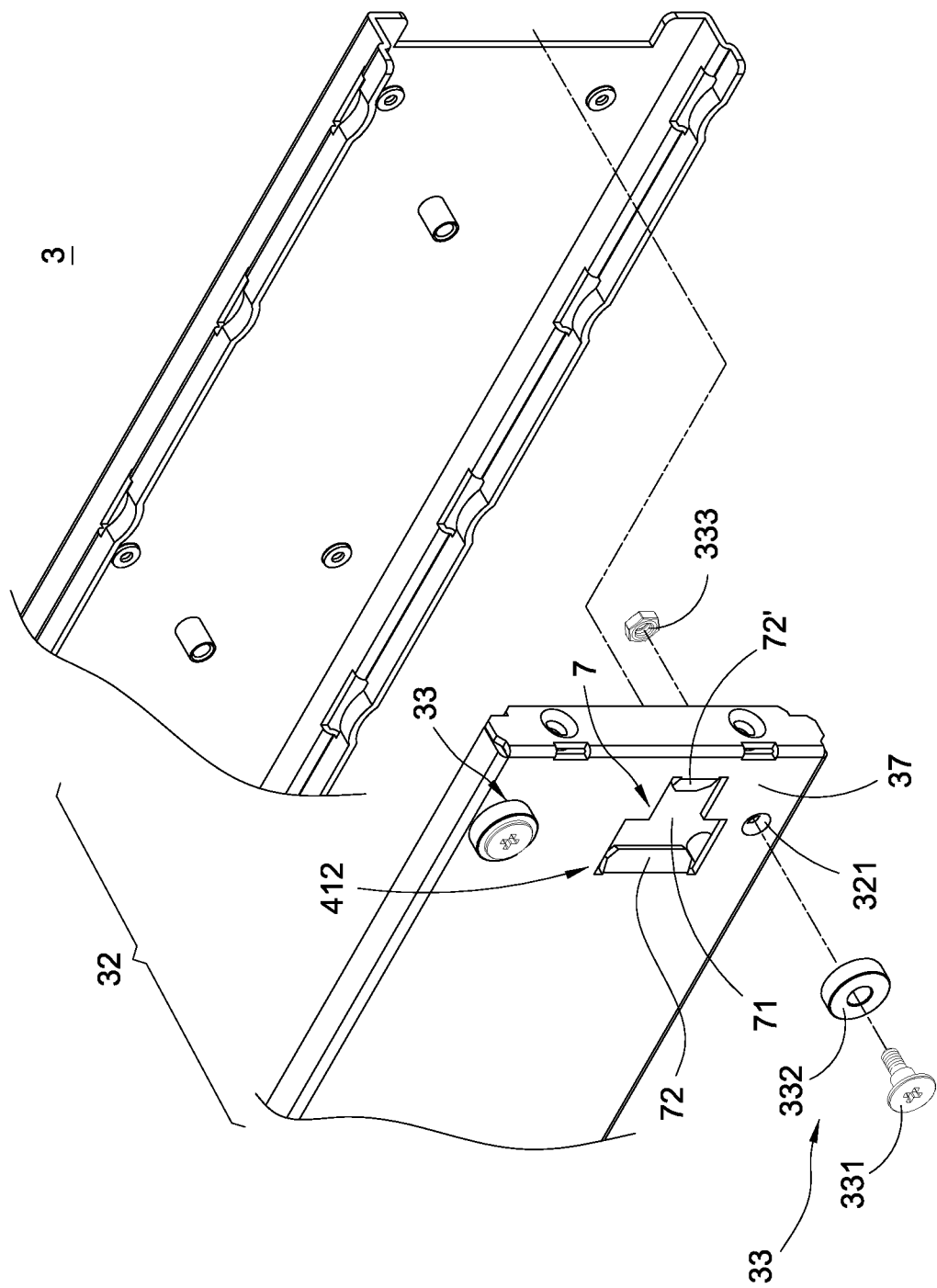
FIG. 5 is another local perspective view of a two-way slide rail assembly according to the present invention.

As shown in FIGS. 2-4, the stop assembly 4 is connected between the first slide rail assembly 31 and the second slide rail assembly 32, and correspondingly stop and position the first slide rail assembly 31 and the second slide rail assembly 32. The further explanation is given below.

The stop assembly 4 comprises a first stop member 41 having a first engaging member 411 and a first connecting member 412, and a second stop member 42 having a second engaging member 421 and a second connecting member 422. The first engaging member 411 and the second engaging member 421 are both connected to one of the first slide rail assembly 31 and the second slide rail assembly 32; the first connecting member 412 and the second connecting member 422 are both connected to the other one of the first slide rail assembly 31 and the second slide rail assembly 32. The first engaging member 411 and the first connecting member 412 can stop and position with each other; the second engaging member 421 and the second connecting member 422 can stop and position with each other.

In the current embodiment, the first engaging member 411 is a first elastic member 6' installed at the first end 34. The first connecting member 412 is a latch slot 7 formed at the fourth end 37. The second engaging member 421 is a second elastic member 6 installed at the second end 35. The second connecting member 422 is another latch slot 7 formed at the third end 36.

The first elastic member 6' has a positioning projection 61' and a first elastic segment 62'. The second elastic member 6 has only a second elastic segment 62. The first slide rail assembly 31 is provided with a positioning slot 38 for positioning the positioning projection 61', a first open slot 39' for receiving the first elastic segment 62', and a second open slot 39 for receiving the second elastic segment 62.

Each latch slot 7 is a through hole 71 in which two pressing members 72, 72' extend from opposite edges of the through hole 71, respectively, away from the elastic member 6 or 6'. The first elastic segment 62' and the second elastic segment 62 are embedded in two through holes 71, respectively. When the first elastic segment 62' and the second elastic segment 62 are not under force, they protrude from the through holes 71 and their edges can stop and position in the through holes 71 correspondingly such that the first elastic segment 62' and the second elastic segment 62 be latched in the through holes 71, respectively.

When the first elastic segment 62' and the second elastic segment 62 are to be detached from the through holes 71, respectively, a slight force can be applied to push the surfaces of the first elastic segment 62' and the second elastic segment 62 to contact the pressing members 72, 72', respectively. Because the surfaces are pressed inward and guided by the pressing members 72, 72', respectively, the first elastic segment 62' and the second elastic segment 62 can actuate the movement of the elastic segments to retract correspondingly into the through holes 71. Finally, the first elastic segment 62' and the second elastic segment 62 gradually retract, slide outward, and are thus detached from the through holes 71, respectively.

Figure 6:
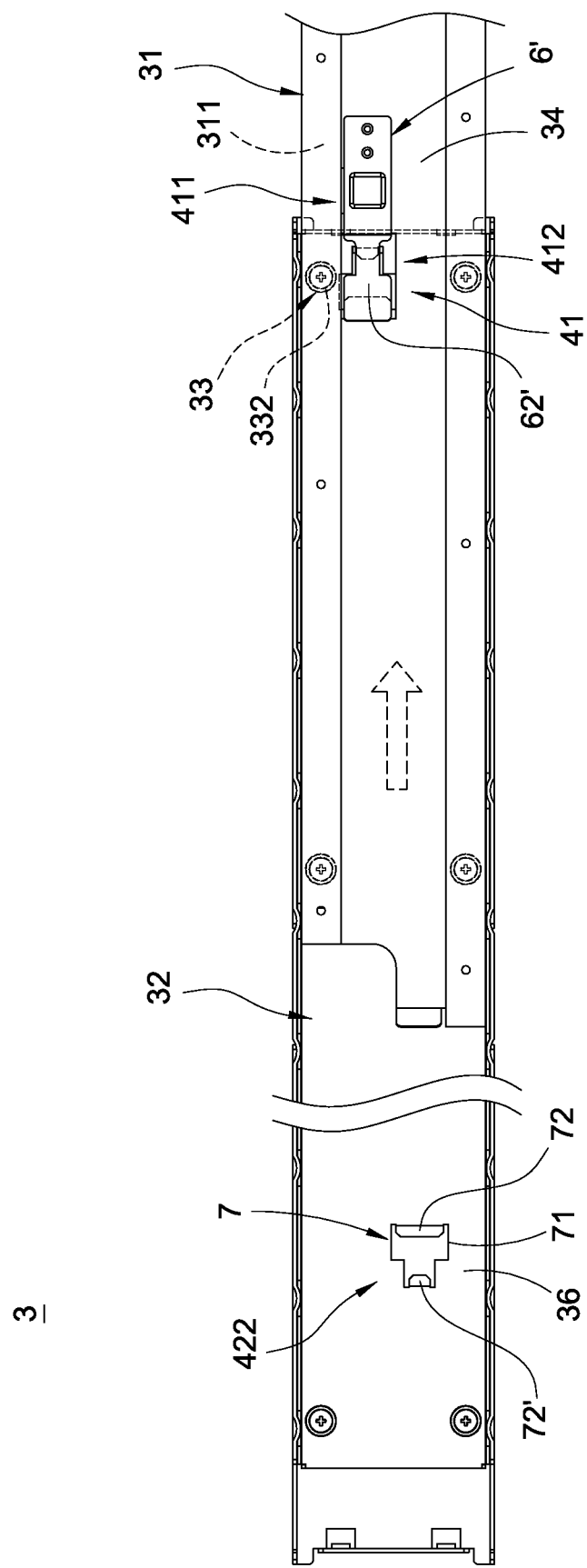
FIG. 6 is a schematic view of a two-way slide rail assembly in an operation state according to the present invention.

In addition, when one end of the first slide rail assembly 31 slides to a limitation of the second slide rail assembly 32 as shown in FIG. 6, the first elastic segment 62' can be latched in the through hole 71 and stop and position the through hole 71. Meanwhile, the positioning projection 61' is exposed to the cabinet 1. The positioning projection 61' and the first elastic segment 62' are formed on the first elastic member 6' so when the positioning projection 61' is pressed, it will bring the first elastic segment 62' to retract into the through hole 71 and the first open slot 39'. Therefore, the first elastic segment 62' retract inward and cannot be latched in the through hole 71. Further, the first slide rail assembly 31 and the second slide rail assembly 32 are not latched and limited by the first elastic segment 62' and the through hole 71, which allows the first slide rail assembly 31 and the second slide rail assembly 32 can slide away and be detached from each other and then pulls the drawer 2 out of the cabinet 1.

The combination of the two-way slide rail structure of the present invention, as shown in FIGS. 2 and 3, uses a two-way slide rail assembly 3 comprising a first slide rail assembly 31, a second slide rail assembly 32, and rollers 33. The first slide rail assembly 31 is provided with a slide rail 311; the second slide rail assembly 32 is disposed corresponding to the first slide rail assembly 31; the rollers 33 are installed on the second slide rail assembly 32 and roll along the slide rail 311 such that the first slide rail assembly 31 can slide with respect to the second slide rail assembly 32. The stop assembly 4 is attached between the first slide rail assembly 31 and the second slide rail assembly 32, and correspondingly stops and positions the first slide rail assembly 31 and the second slide rail assembly 32.

The combination of the industrial computer cabinet 10 of the present invention, as shown in FIGS. 1-3, uses a cabinet 1 having a receiving space 11, a first opening 12, and a second openings 13 in which the first opening 12 and the second opening 13 communicate with the receiving space 11 and are disposed at opposite sides thereof, a drawer 2 disposed in the receiving space 11, and a pair of the two-way slide rail structures described above. Each of the two-way slide rail structures is connected between sides of the cabinet 1 and the drawer 2. The first slide rail assembly 31 is fixed to one of the cabinet 1 and the drawer 2; the second slide rail assembly 32 is fixed to the other of the cabinet 1 and the drawer 2 can be pulled out, sliding with respect to the cabinet 1 through either the first opening 12 or the second opening 13. In this way, the rollers 33 are installed on the second slide rail assembly 32 and roll along the slide rail 311 such the drawer 2 slides with respect to the cabinet 1 and can be pulled out through either the first opening 12 or the second opening 13. Further, even when excessive force is exerted to the rollers 33, the drawer 2 can still be moved smoothly, enhancing the use convenience of the industrial computer cabinet 10.

Figure 7:
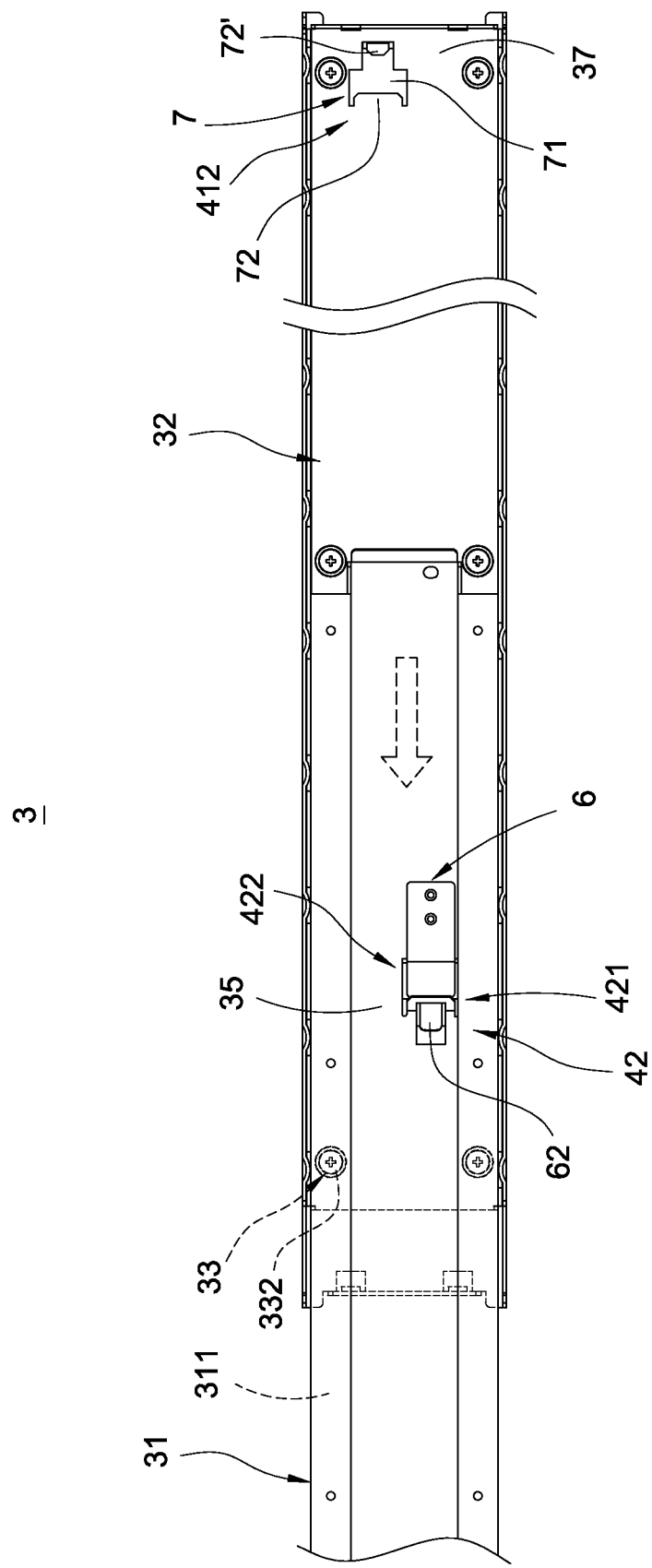
FIG. 7 is a schematic view of a two-way slide rail assembly in another operation state according to the present invention.
Figure 8:
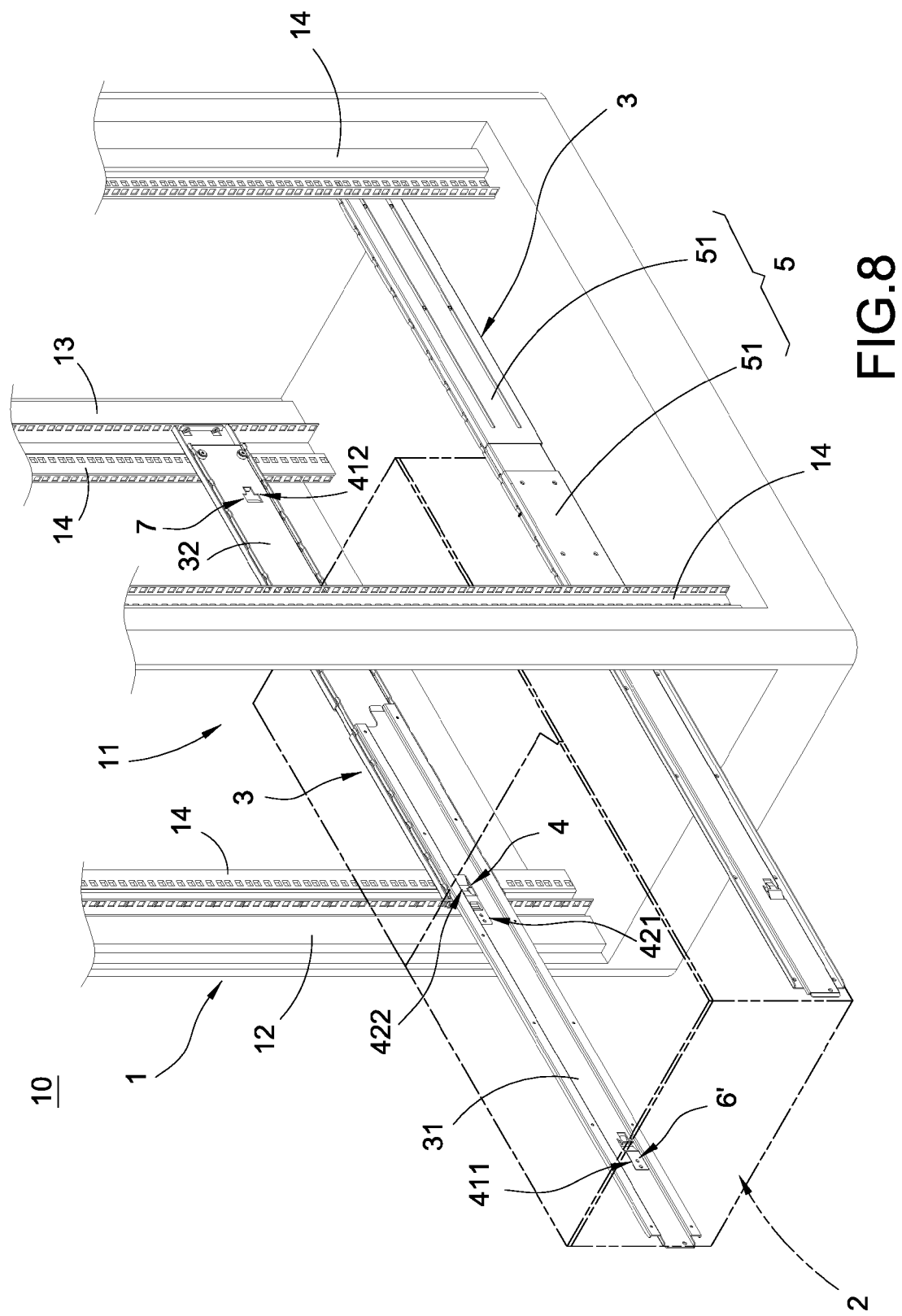
FIG. 8 is a schematic view of a two-way slide rail assembly in yet another operation state according to the present invention.

The operation states of the industrial computer cabinet 10 of the present invention are shown in FIGS. 6-8. The rollers 33 are installed on the second slide rail assembly 32 and slide along the slide rail 311 such that the drawer 2 can slide with respect to the cabinet 1 and be pulled out through the first opening 12 or the second opening 13. In this way, the user can firstly take out the industrial computer apparatuses in the drawer 2 adjacent to the first opening 12 or the second opening 13, which reduces the loading of the drawer 2 and further reduces the loading of maintenance or management, further enhancing the use convenience of the industrial computer cabinet.

Also, the roller 33 comprises a bolt 331 and a wheel 332 sleeved around the bolt 331 so when the overloaded drawer 2 exerts excessive force on the wheel 332, the wheel 332 still can roll relatively to the bolt 331 and maintains the rolling effect, further enhancing the reliable operation of the industrial computer cabinet.

Besides, each stop assembly 4 comprises a first stop member 41 and a second stop member 42. The first stop member 41 has a first engaging member 411 and a first connecting member 412. The second stop member 42 has a second engaging member 421 and a second connecting member 422. The first engaging member 411 and the second engaging member 421 are both connected to one of the first slide rail assembly 31 and the second slide rail assembly 32. The first connecting member 412 and the second connecting member 422 are both connected to the other of the first slide rail assembly 31 and the second slide rail assembly 32. The first engaging member 411 and the first connecting member 412 can stop and position each other. The second engaging member 421 and the second connecting member 422 can stop and position each other. In this way, when the drawer 2 is pulled out through either the first opening 12 or the second opening 13, the drawer 2 can be prevented from be pulled excessively or dragged by its weight to fall away from the cabinet 1. This can improve the structure stability of the industrial computer cabinet 10.

The further explanation is given below. Each first slide rail assembly 31 has a first end 34 and a second end 35. Each second slide rail assembly 32 has a third end 36 and a fourth end 37. The first engaging member 411 is a first elastic member 6' installed at the first end 34; the first connecting member 412 is a latch slot 7 formed at the fourth end 37; the second engaging member 421 is a second elastic member 6 installed at the second end 35; the second connecting member 422 is another latch slot 7 formed at the third end 36.

Also, the first elastic member 6' has a first elastic segment 62'; the second elastic member 6 has a second elastic segment 62. The second slide rail assembly 32 is provided with a first open slot 39' for receiving the first elastic segment 62' and a second open slot 39 for receiving the second elastic segment 62. Each latch slot 7 is a through hole 71 in which two pressing members 72, 72' extend from the left edge and the right edge of the through hole 71, respectively, away from the elastic member 6. The edges of the first elastic segment 62' and the second elastic segment 62 can stop and position that of the through hole 71 correspondingly, further enhancing the stopping and positioning capability of the stop assembly 4.

Moreover, the number of the slide rails 311 is two. Each first slide rail assembly 31 extends toward the second slide rail assembly 32 to form two U-shaped extending portions 312 arranged in upper and lower rows. A side of the respective U-shaped extending portions 312 forms a corresponding side wall 313 on which the respective slide rails 311 are formed. Also, the number of the rollers 33 is above one. The rollers 33 are spaced in parallel upper and lower rows and installed on the second slide rail assembly 32 corresponding to the respective side walls 313. In this way, even forces are exerted on the respective rollers 33, enhancing the sliding function between the rollers 33 and the slide rails 311.

In addition, each two-way slide rail assembly 3 further comprises an auxiliary slide rail assembly 5 having two separate extended frames 51. One of the two separate extended frames 51 is fixed to one of two frames 14, and the other of the two separate extended frames 51 is fixed to the other of the two frames 14. Two ends of the second slide rail assembly 32 are disposed between and fixed to the two extended frames 51. In this way, the two-way slide rail assembly 3 can be fit for the cabinets 1 of different sizes. Also, the secure locking and force exerted evenly between the two-way slide rail assemblies 3 and the cabinet 1 can be insured, which enables the two-way slide rail assembly 3 to have a wide application range and great structure strength.

Figure 9:
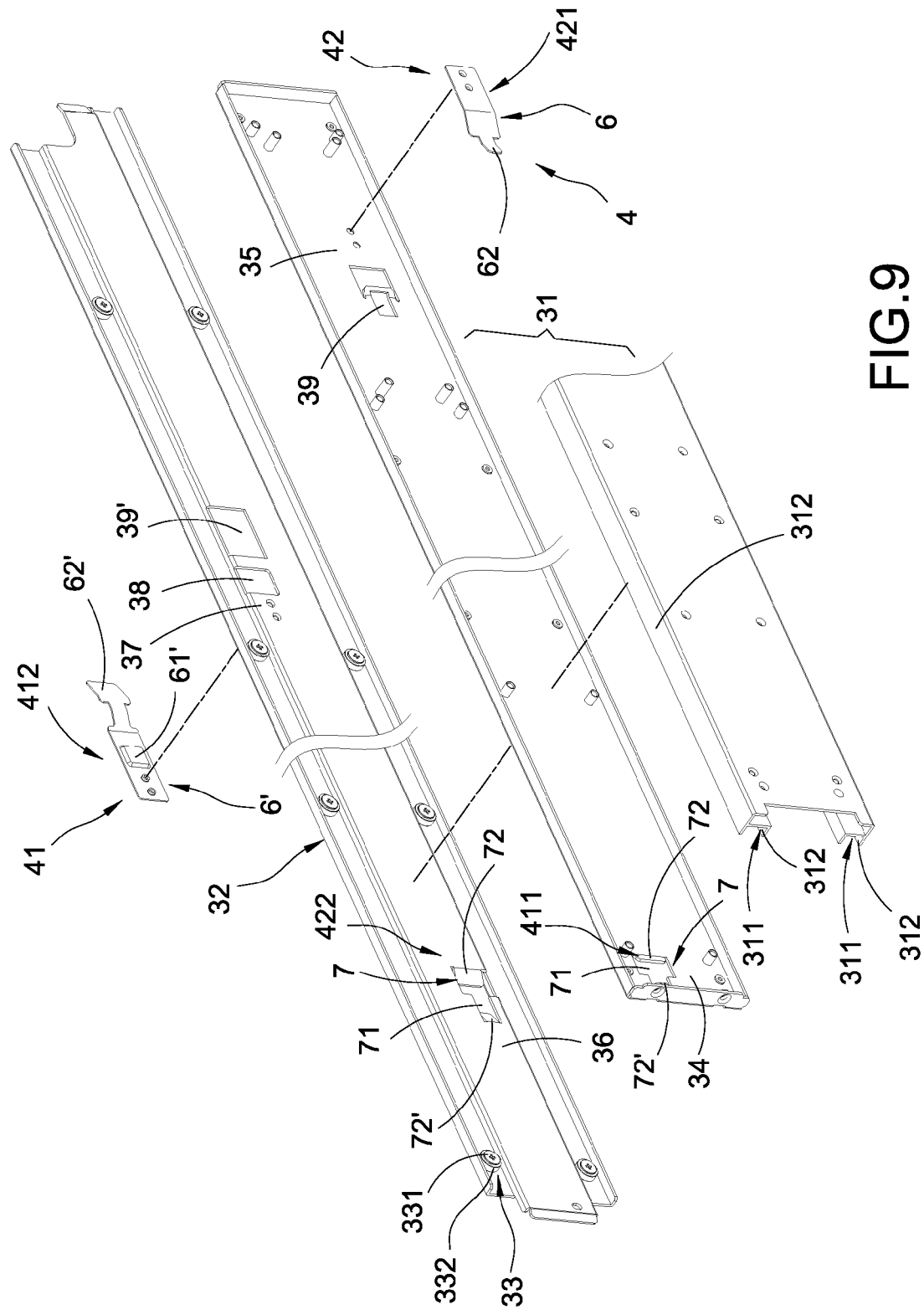
FIG. 9 is a perspective exploded view of a two-way slide rail assembly according to another embodiment of the present invention.
Figure 10:
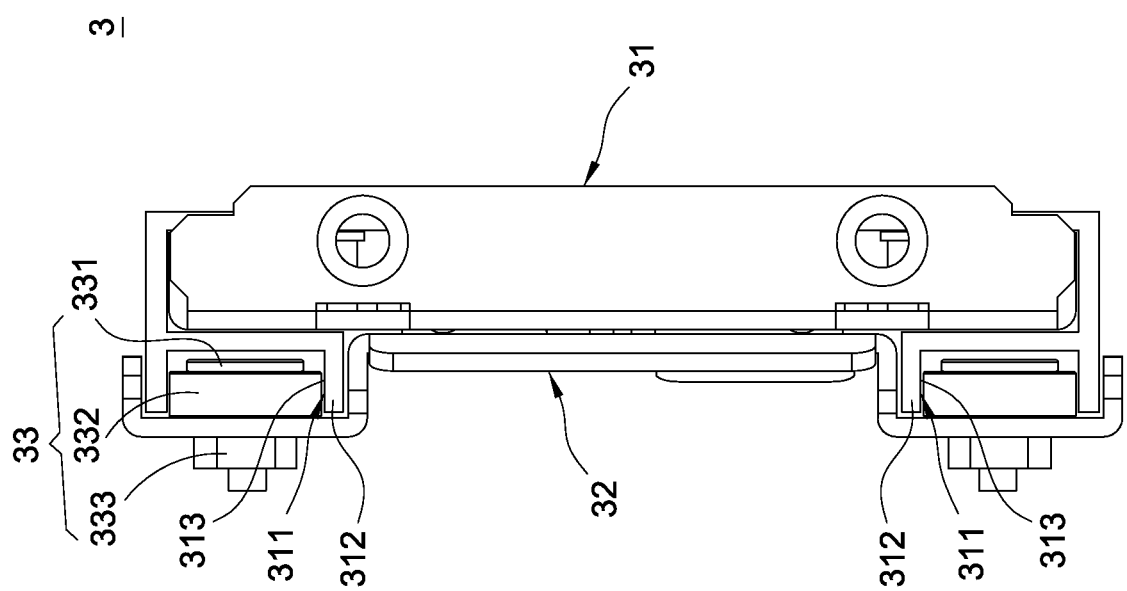
FIG. 10 is a cross-sectional schematic view of a two-way slide rail assembly according to another embodiment of the present invention.

Please refer to FIGS. 9-10, which show an industrial computer cabinet 10 according to another embodiment of the present invention. The current embodiment is basically similar to the embodiment shown in FIGS. 1-8; the difference in between is that the first slide rail assembly 31 and the second slide rail assembly 32 can be installed reversely and the structures of the first stop member 41 and the second stop member 42 can be adjusted according to operation requirements.

The further explanation is given below. Each first slide rail assembly 31 can be fixed to the frame 14; each second slide rail assembly 32 can be fixed to the drawer 2. In addition, two ends of the first slide rail assembly 31 can be disposed between and fixed to the two extended frames 51.

Moreover, the first engaging member 411 is a latch slot 7 formed at the first end 34; the first connecting member 412 is a first elastic member 6' installed at the fourth end 37; the second engaging member 421 is a second elastic member 6 installed at the second end 35; the second connecting member 422 is another latch slot 7 formed at the third end 36.

In the current embodiment, each latch slot 7 is a through hole 71 in which two pressing members 72, 72' extend from the left edge and the right edge of the through hole 71, respectively, away from the second elastic member 6. The first elastic member 6' has a positioning projection 61' and a first elastic segment 62'. The second elastic member 6 has only a second elastic segment 62. The first slide rail assembly 31 is provided with a second open slot 39 for receiving the second elastic segment 62. The second slide rail assembly 32 is provided with a first open slot 39' for receiving the first elastic segment 62'. The edges of the first elastic segment 62' and the second elastic segment 62 can stop and position that of the through hole 71 correspondingly. The first elastic segment 62' and second elastic segment 62 can be pressed against by the pressing members 72, 72' to be guided to have a more smooth movement of the elastic segments.

Besides, the first slide rail assembly 31 is provided with a positioning slot 38 for positioning the positioning projection 61'. When the positioning projection 61' is pressed, it will bring the first elastic segment 62' to detach from the first open slot 39' such that the first elastic segment 62' cannot stop the through hole 71 mutually, further allowing the second slide rail assembly 32 to slide out of the first slide rail assembly 31. Thus, the drawer 2 is pulled out of the cabinet 1 separately Though the first slide rail assembly 31 and the second slide rail assembly 32 can be installed reversely in the current embodiment and the structures of the first stop member 41 and the second stop member 42 can be adjusted according to operation requirements, the effects desired to be achieved by the present invention do not be affected. Therefore, the current embodiment has the same functions and effects as the embodiment shown in FIGS. 1-8.

Figure 11:
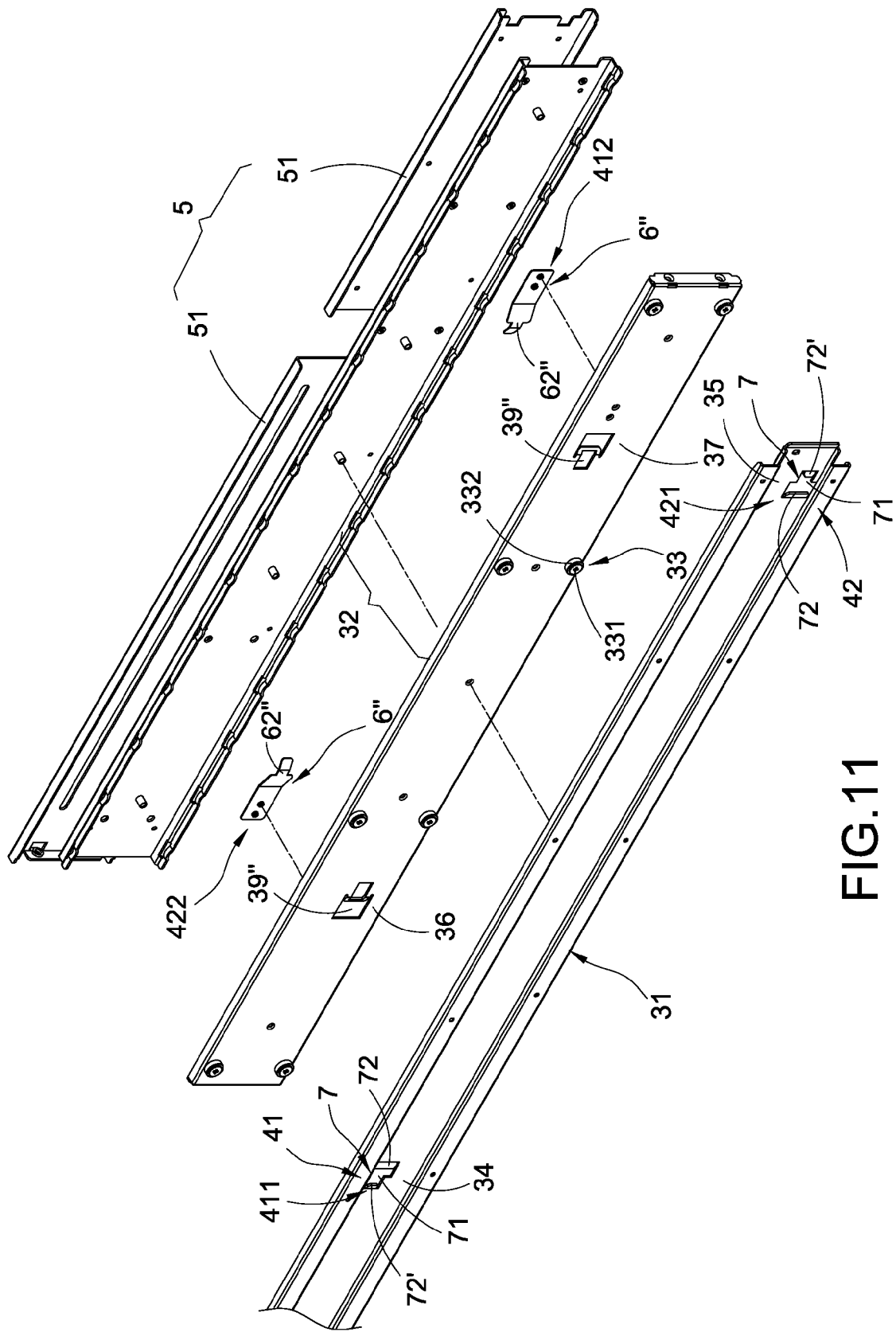
FIG. 11 is a perspective exploded view of a two-way slide rail assembly according to yet another embodiment of the present invention.

Please refer to FIG. 11, which shows an industrial computer cabinet 10 according to yet another embodiment of the present invention. The current embodiment is basically similar to the embodiment shown in FIGS. 1-8; the difference in between is that the structures of the first stop member 41 and the second stop member 42 can also be adjusted according to operation requirements.

The further explanation is given below. The first slide rail assembly 31 has a first end 34 and a second end 35. The second slide rail assembly 32 has a third end 36 and a fourth end 37. The first engaging member 411 is a latch slot 7 formed at the first end 34; the first connecting member 412 is an elastic member 6" installed at the fourth end 37; the second engaging member 421 is another latch slot 7 formed at the second end 35; the second connecting member 422 is another elastic member 6" installed at the third end 36.

In the current embodiment, each elastic member 6" has an elastic segment 62". The second slide rail assembly 32 is provided with two open slots 39" for receiving the elastic segments 62". Each latch slot 7 is a through hole 71 in which two pressing members 72, 72' extend from the left edge and the right edge of the through hole 71, respectively, away from the elastic member 6". The edge of the elastic segment 62" can stop and position that of the through hole 71 correspondingly and the elastic segment 62" can be pressed against by the two pressing members 72, 72' to be guided to have a more smooth movement of the elastic segments. Thus, though the structures of the first stop member 41 and the second stop member 42 can also be adjusted according to operation requirements, the effects desired to be achieved by the present invention do not be affected. Therefore, the current embodiment has the same functions and effects as the embodiment shown in FIGS. 1-8.

In summary, the industrial computer cabinet and the two-way slide rail structure thereof about which there is not similar product used in pubic are therefore useful, novel and non-obvious. Please examine the application carefully and grant it a patent for protecting the rights of the inventor.

What is claimed is:

1. A two-way slide rail structure, comprising:
    a two-way slide rail assembly (3) comprising:
    a first slide rail assembly (31) provided with at least one slide rail (311);
    a second slide rail assembly (32) disposed corresponding to the first slide rail assembly (31); and
    at least one roller (33) installed on the second slide rail assembly (32) and rolling along the at least one slide rail (311) such that the first slide rail assembly (31) slides with respect to the second slide rail assembly (32); and at least one stop assembly (4) attached between the first slide rail assembly (31) and the second slide rail assembly (32), and correspondingly stopping and positioning the first slide rail assembly (31) and the second slide rail assembly (32), wherein the at least one stop assembly (4) comprises a first stop member (41) having a first engaging member (411) and a first connecting member (412), and a second stop member (42) having a second engaging member (421) and a second connecting member (422), wherein the first engaging member (411) and the second engaging member (421) are both connected to one of the first slide rail assembly (31) and the second slide rail assembly (32), wherein the first connecting member (412) and the second connecting member (422) are both connected to the other of the first slide rail assembly (31) and the second slide rail assembly (32), wherein the first engaging member (411) and the first connecting member (412) can stop and position with each other, wherein the second engaging member (421) and the second connecting member (422) can stop and position with each other;

wherein the first slide rail assembly (31) has a first end (34) and a second end (35), wherein the second slide rail assembly (32) has a third end (36) and a fourth end (37), wherein the first engaging member (411) is a first elastic member (6') installed at the first end (34), wherein the first connecting member (412) is a latch slot (7) formed at the fourth end (37), wherein the second engaging member (421) is a second elastic member (6) installed at the second end (35), wherein the second connecting member (422) is another latch slot (7) formed at the third end (36);

wherein the first elastic member (6') has a positioning projection (61) and a first elastic segment (62'), wherein the second elastic member (6) has a second elastic segment (62), wherein the first slide rail assembly (31) is provided with a positioning slot (38) for positioning the positioning projection (61'), a first open slot (39') for receiving the first elastic segment (62'), and a second open slot (39) for receiving the second elastic segment (62), wherein the latch slot (7) is a through hole (71), wherein two pressing members (72, 72') extend from the left edge and the right edge of the through hole (71), respectively, away from the elastic member (6 or 6'), wherein the edge of the elastic segment (62 or 62') can stop and position in the through hole (71) correspondingly and the elastic segment (62 or 62') can be pressed against by the two pressing members (72, 72').

2. The two-way slide rail structure according to claim 1, wherein the second slide rail assembly (32) is provided with at least one through-hole (321), wherein the at least one roller (33) comprises a bolt (331), a wheel (332), and a nut (333), wherein the wheel (332) is sleeved around the bolt (331), wherein the nut (333) is configured corresponding to the at least one through-hole (321), wherein the end of the bolt (331) passes through the at least one through-hole (321) to be fastened by the nut (333), wherein the wheel (332) is engaged with the at least one slide rail (311) to roll in the at least one slide rail (311).

3. The two-way slide rail structure according to claim 1, wherein the first slide rail assembly (31) extends at one lateral side thereof to form a U-shaped extending portion (312), wherein at least one side wall (313) is formed on a side of the U-shaped extending portion (312) to be the slide rail (311).

4. The two-way slide rail structure according to claim 1, wherein the number of the at least one slide rail (311) is two, wherein the first slide rail assembly (31) extends at both lateral sides thereof to form two U-shaped extending portions (312), wherein each side of the respective U-shaped extending portion (312) forms a corresponding side wall (313) on which the respective slide rails (311) are formed, wherein the number of the at least one roller (33) is more than one and the rollers (33) are spaced in parallel upper and lower rows and installed on the second slide rail assembly (32), each row of the rollers (33) corresponding to two corresponding side walls (313) of the U-shaped extending portion (312).

5. A two-way slide rail structure, comprising:
a two-way slide rail assembly (3) comprising:
a first slide rail assembly (31) provided with at least one slide rail (311);
a second slide rail assembly (32) disposed corresponding to the first slide rail assembly (31); and
at least one roller (33) installed on the second slide rail assembly (32) and rolling along the at least one slide rail (311) such that the first slide rail assembly (31) slides with respect to the second slide rail assembly (32); and
at least one stop assembly (4) attached between the first slide rail assembly (31) and the second slide rail assembly (32), and correspondingly stopping and positioning the first slide rail assembly (31) and the second slide rail assembly (32),
wherein the at least one stop assembly (4) comprises a first stop member (41) having a first engaging member (411) and a first connecting member (412), and a second stop member (42) having a second engaging member (421) and a second connecting member (422), wherein the first engaging member (411) and the second engaging member (421) are both connected to one of the first slide rail assembly (31) and the second slide rail assembly (32), wherein the first connecting member (412) and the second connecting member (422) are both connected to the other of the first slide rail assembly (31) and the second slide rail assembly (32), wherein the first engaging member (411) and the first connecting member (412) can stop and position with each other, wherein the second engaging member (421) and the second connecting member (422) can stop and position with each other;
wherein the first slide rail assembly (31) has a first end (34) and a second end (35), wherein the second slide rail assembly (32) has a third end (36) and a fourth end (37), wherein the first engaging member (411) is a latch slot (7) formed at the first end (34), wherein the first connecting member (412) is a first elastic member (6') installed at the fourth end (37), wherein the second engaging member (421) is a second member (6) installed at the second end (35), wherein the second connecting member (422) is another latch slot (7) formed at the third end (36);
wherein each latch slot (7) is a through hole (71), wherein two pressing members (72, 72') extend from the left edge and the right edge of the through hole (71), respectively, away from the second elastic member (6), wherein the first elastic members (6') has a positioning projection 61' and second elastic segment (62'), wherein the second elastic member (6) has only a second elastic segment (62), wherein the second slide rail assembly (32) is provided with a first open slot (39') for receiving the first elastic segment (62'), wherein the edges of the first elastic segment (62') and the second elastic segment (62) can stop and position that of the through hole 71 correspondingly and the first elastic segment (62') and second elastic segment (62) can be pressed against by the pressing members (72, 72'), wherein the second slide rail assembly (32) is provided with a first open slot (39') for receiving the first elastic segment (62').

6. A two-way slide rail structure, comprising:
a two-way slide rail assembly (3) comprising:
a first slide rail assembly (31) provided with at least one slide rail (311);
a second slide rail assembly (32) disposed corresponding to the first slide rail assembly (31); and
at least one roller (33) installed on the second slide rail assembly (32) and rolling along the at least one slide rail (311) such that the first slide rail assembly (31) slides with respect to the second slide rail assembly (32); and
at least one stop assembly (4) attached between the first slide rail assembly (31) and the second slide rail assembly (32), and correspondingly stopping and positioning the first slide rail assembly (31) and the second slide rail assembly (32),
wherein the at least one stop assembly (4) comprises a first stop member (41) having a first engaging member (411) and a first connecting member (412), and a second stop member (42) having a second engaging member (421) and a second connecting member (422), wherein the first engaging member (411) and the second engaging member (421) are both connected to one of the first slide rail assembly (31) and the second slide rail assembly (32), wherein the first connecting member (412) and the second connecting member (422) are both connected to the other of the first slide rail assembly (31) and the second slide rail assembly (32), wherein the first engaging member (411) and the first connecting member (412) can stop and position with each other, wherein the second engaging member (421) and the second connecting member (422) can stop and position with each other;
wherein the first slide rail assembly (31) has a first end (34) and a second end (35), wherein the second slide rail assembly (32) has a third end (36) and a fourth end (37), wherein the first engaging member (411) is a latch slot (7) formed at the first end (34), wherein the first connecting member (412) is an elastic member (6") installed at the fourth end (37), wherein the second engaging member (421) is another latch slot (7) formed at the second end (35), wherein the second connecting member (422) is another elastic member (6") installed at the third end (36);
wherein each elastic member (6") has an elastic segment (62"), wherein the second slide rail assembly (32) is provided with two open slots (39") for receiving the elastic segments (62"), wherein each latch slot (7) is a through hole (71), wherein two pressing members (72, 72') extend from the left edge and the right edge of the through hole (71), respectively, away from the elastic member (6"), wherein the edge of the elastic segment (62") can stop and position that of the through hole (71) correspondingly and the elastic segment (62") can be pressed against by the two pressing members (72, 72').

\* \* \* \* \*